United States Patent [19]
Grodzinski et al.

[11] Patent Number: 5,557,626
[45] Date of Patent: Sep. 17, 1996

[54] PATTERNED MIRROR VCSEL WITH ADJUSTABLE SELECTIVE ETCH REGION

[75] Inventors: Piotr Grodzinski, Chandler; Michael S. Lebby, Apache Junction, both of Ariz.; Hsing-Chung Lee, Calabasas, Calif.

[73] Assignee: Motorola, Schaumburg, Ill.

[21] Appl. No.: 261,272

[22] Filed: Jun. 15, 1994

[51] Int. Cl.⁶ ........................................ H01S 3/19
[52] U.S. Cl. .................... 372/45; 372/43; 437/228
[58] Field of Search .................... 372/45, 43, 50; 437/228

[56] References Cited

U.S. PATENT DOCUMENTS

| | | | |
|---|---|---|---|
| 5,206,871 | 4/1993 | Deppe et al. | 372/45 |
| 5,245,622 | 9/1993 | Jewell et al. | 372/45 |
| 5,258,990 | 11/1993 | Olbright et al. | 372/45 |
| 5,314,838 | 5/1994 | Cho et al. | 372/45 |
| 5,363,393 | 11/1994 | Uomi et al. | 372/45 |

*Primary Examiner*—Rodney B. Bovernick
*Assistant Examiner*—Yisun Song
*Attorney, Agent, or Firm*—Eugene A. Parsons

[57] ABSTRACT

Patterned-mirrors for VCSELs are fabricated by forming a first mirror stack of a plurality of pairs of relatively high and low index of refraction layers, forming an active region of aluminum-free material on the first mirror stack, and forming a second mirror stack of a plurality of pairs of relatively high and low index of refraction layers. The second mirror stack includes first and second portions of materials selected to provide different rates of etching between the first and second portions. The second portion is selectively etched to the first portion by utilizing the first portion as an etch stop.

14 Claims, 2 Drawing Sheets

PATTERNED MIRROR VCSEL WITH ADJUSTABLE SELECTIVE ETCH REGION

FIELD OF THE INVENTION

The present invention pertains to vertical cavity surface emitting lasers (VCSELs) and more specifically to VCSELs with an adjustable selective etch region.

BACKGROUND OF THE INVENTION

In prior art semiconductor lasers, as typically disclosed in U.S. Pat. No. 5,172,384, entitled "Low Threshold Current Laser", issued Dec. 15, 1992, it is common to form an active region with an indium gallium arsenide quantum well, having guiding layers and cladding layers of aluminum gallium arsenide on both sides thereof. Further, it is typical to form Bragg reflectors, or mirror stacks, on each side of the active region, which mirror stacks generally include aluminum gallium arsenide. The epitaxial configuration of VCSELs is well defined, however, various processing schemes can be utilized.

The most commonly used structure involves proton implantation in order to separate individual devices on a substrate. The advantage of this structure is its planar character; it suffers, however from instability of optical lateral mode and relatively high threshold currents due to the large current spreading.

In instances where the semiconductor laser is to be a ridge waveguide, or patterned mirror, laser, the upper mirror stack is etched to the correct depth by knowing the exact rate of etch and timing the etch process. This prior art method of etching the upper mirror stack is very difficult and inaccurate. Thus, the prior art patterned mirror VCSELs have relatively low threshold currents but lack the needed reliability.

In some instances, such as in a copending application entitled "VCSEL With Vertical Offset Operating Region Providing a Lateral Waveguide and Current Limiting and Method of Fabricating", U.S. Pat. No. 5,351,257, filed Mar. 8, 1993, including an etch-stop layer in the upper mirror stack has been proposed to automatically stop the etch at a desired depth.

In a U.S. Pat. No. 5,293,392, entitled "Top Emitting VCSEL with Etch Stop Layer", issued Mar. 8, 1994 an etch stop layer is grown in the second, or upper, mirror stack and utilized to automatically stop the etch at a desired level. While the etch stop method utilizes the excellent control achieved in MOVPE growth to define the patterned mirror height, the growth of a layer of dissimilar material (the etch stop layer) is required which adds some complication to the fabrication process.

To provide such an etch-stop layer, a layer from a different material system must be epitaxially grown between layers of the normal or desired material system. Thus, epitaxial layers of the normal or desired material system are grown to a desired height. The epitaxial growth is then stopped and restarred with the different material system until the etch-stop layer of desired thickness is grown. The original epitaxial growth is then continued until the device is completed. Generally, this is difficult and requires substantial effort and time to complete.

In a copending application entitled "VCSEL With Al-Free Cavity Region", filed of even date herewith, An aluminum-free active region is utilized as the etch stop. However, in some instances it is desirable to terminate the etching of the upper mirror stack before the active region is reached.

Accordingly, it is desirable to provide a method of easily and accurately etching the upper mirror stack of a VCSEL.

It is a purpose of the present invention to provide a method of easily and accurately fabricating patterned mirror VCSELs.

It is a further purpose of the present invention to provide a method of fabricating VCSELs which is relatively easy to perform and which accurately stops the etching process before damaging the active region.

It is a further purpose of the present invention to provide a method of fabricating VCSELs which results in VCSELs that are highly reliable, relative to prior art VCSELs.

It is a further purpose of the present invention to provide VCSELs which are highly reliable, relative to prior art VCSELs.

SUMMARY OF THE INVENTION

The above problems are at least partially solved and the above purposes are realized in a method of fabricating patterned-mirrors for VCSELs including forming a first mirror stack of a first conductivity type, forming an active region on the first mirror stack, and forming a second mirror stack of a second conductivity type on the active region. The second mirror stack is formed of a first portion including at least one pair of relatively high and low index of refraction layers positioned on the active region and a second portion including at least one pair of relatively high and low index of refraction layers positioned on the first portion to form a complete second mirror stack. The number of pairs of relatively high and low index of refraction layers in the first and second portions, combined, is sufficient to provide a required reflectivity for operation of the VCSEL, and the first and second portions include materials selected to provide different rates of etching between the first and second portions to allow the second portion to be selectively etched with respect to the first portion. Thus, the depth of etching of the second mirror stack is controlled by the relative thicknesses of the first and second portions of the second mirror stack.

BRIEF DESCRIPTION OF THE DRAWINGS

Referring to the drawings.

DESCRIPTION OF THE PREFERRED EMBODIMENT

Figure 1:
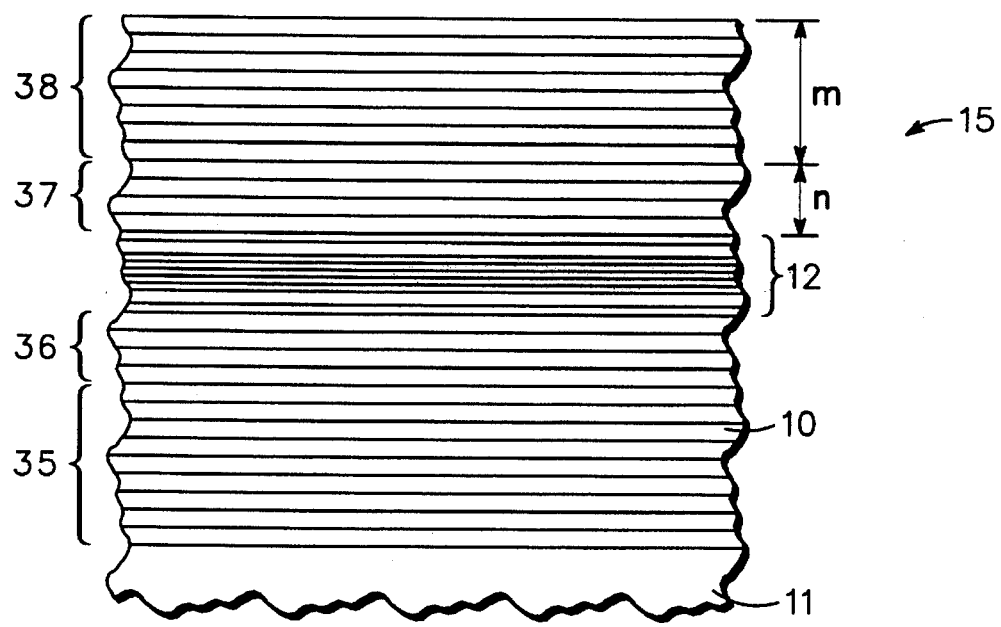
FIG. 1 is a simplified sectional view of a first stage in the fabrication of a patterned mirror VCSEL in accordance with the present invention.

Referring to FIG. 1 a simplified sectional view of an intermediate structure realized in various different steps of a fabrication method in accordance with the present invention are illustrated. In particular, FIG. 1 illustrates a first mirror stack 10 having an active region 12 formed thereon. Mirror stack 10 is generally formed, for example, by epitaxially growing a plurality of layers semiconductor material with alternating high and low indexes of refraction on a substrate 11. Each pair of alternating layers are grown to a thickness of one quarter of the emission wavelength propagating in the layers, and the number of pairs is chosen to provide as much reflectivity of light as possible while limiting the stack to a practical number.

A second mirror stack 15 is formed, on the upper surface of active region 12 by, for example, epitaxially growing pairs of semiconductor layers as described in conjunction with mirror stack 10. Generally, the pairs of layers will be formed of materials similar to those of mirror stack 10 and the thicknesses Will be similar to provide the proper reflectivity of a selected wavelength or spectrum of wavelengths. Also, the first and second mirror stacks are doped with opposite conductivity types to form a two terminal (diode) structure for the flow of electrical current therethrough. In this specific embodiment, for example, mirror stack 10 is doped for n-type conductivity and mirror stack 15 is doped for p-type conductivity.

Active region 12 generally includes one or more quantum wells separated by, barrier layers with a spacer or cladding layer on either side thereof. The quantum wells, barrier layers and spacer layers are also grown epitaxially. The quantum wells produce photons (light) in accordance with a well known phenomenon when properly energized by electrical current applied thereacross. In general, the greater the current applied to active region 12 the greater the number of photons generated. The photons are reflected by the mirror stacks and produce the well known lasing effect that ultimately produces the emitted light. The wavelength of the light is determined by the materials utilized in the quantum well or wells in active region 12 and the thickness of the alternating pairs of layers in the mirror stacks.

Active region 12 is formed from a material system different generally than the material system of mirror stacks 10 and 15 and, in this embodiment, is selected to be aluminum-free. Aluminum is susceptible to oxidation and, it is believed, contributes substantially to the unreliability of active region 12, eventually, resulting in the failure of the VCSEL. By selecting the different material system of active region 12 so that it does not contain aluminum, the reliability and life span of the VCSELs is substantially improved. Additional information is available in a copending U.S. patent application entitled "VCSEL With Al-Free Cavity Region", filed of even date herewith, and included herein by reference.

Figure 2:
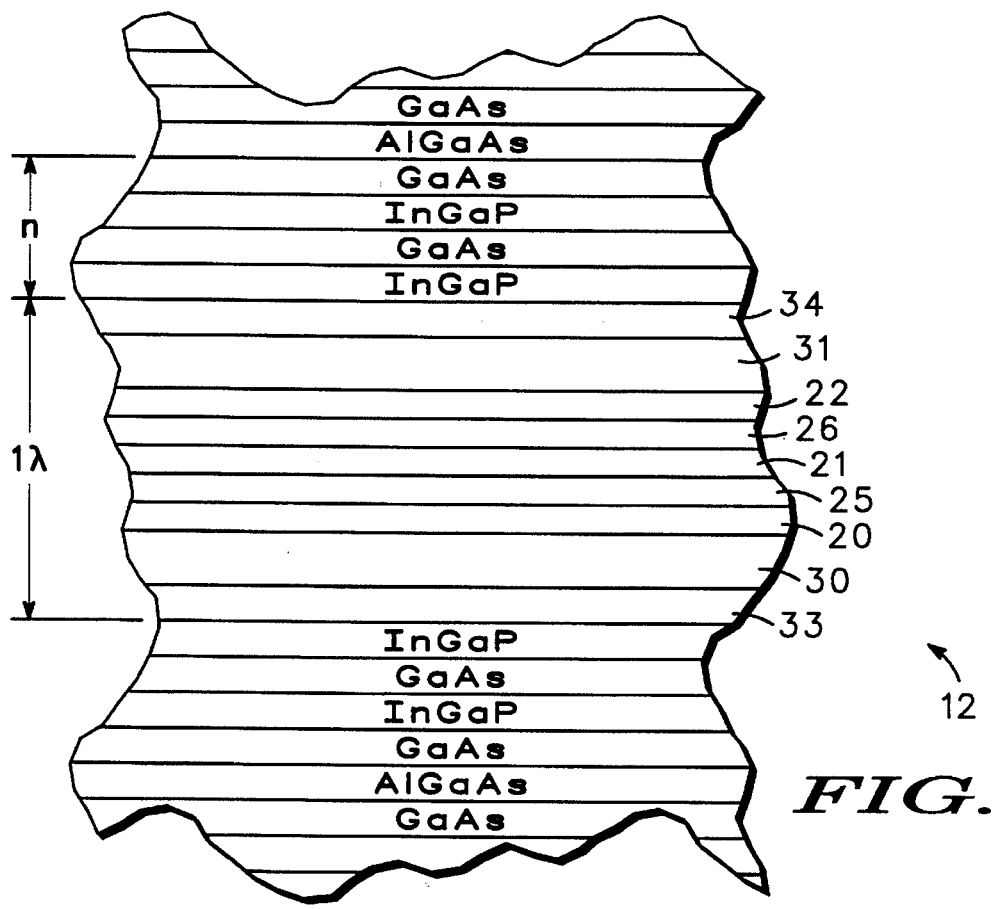
FIG. 2 is a greatly enlarged sectional view of a portion of the structure of FIG. 1.
Figure 3:
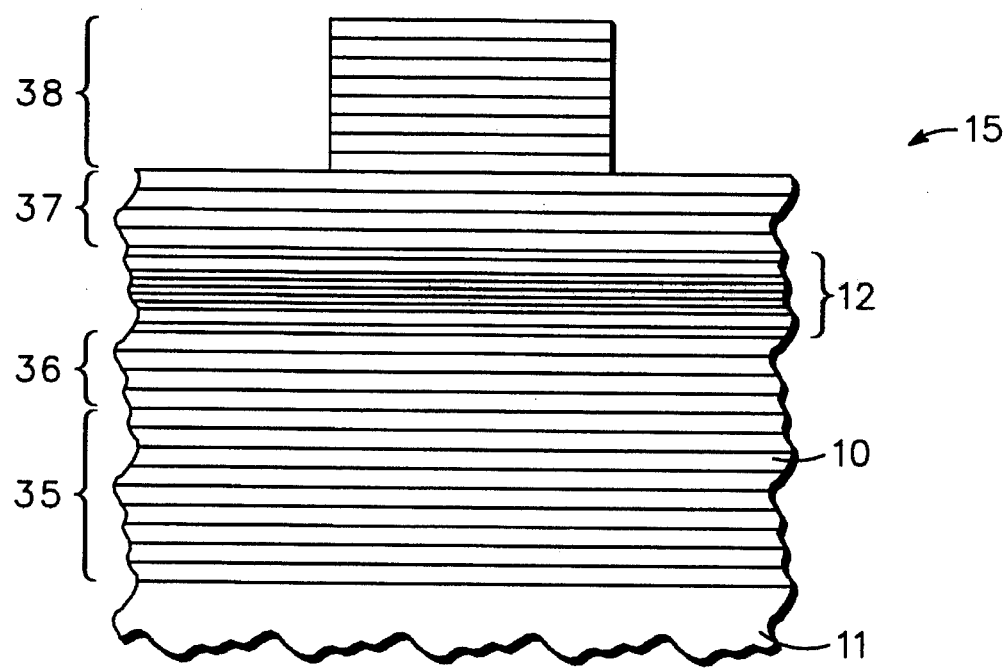
FIG. 3 is a simplified sectional view of a second stage in the fabrication of a patterned mirror VCSEL in accordance with the present invention.

Referring specifically to FIG. 2, a greatly enlarged and simplified sectional view of active region 12 for this specific embodiment is illustrated. In this specific embodiment, active region 12 includes three quantum wells 20, 21 and 22 formed with barrier layers 25 and 26 sandwiched therebetween. Quantum wells 20, 21 and 22, separated by barrier layers 25 and 26, are sandwiched between spacer or guiding layers 30 and 31 which are in turn sandwiched between cladding layers 33 and 34. Generally, spacer layers 30 and 31 and cladding layers 33 and 34 are graded to provide guiding action, as described in more detail in U.S. Pat. No. 5,172,384, described above and included herein by reference.

InGaP/InGaAsP materials cover a suitable range of bandgaps needed for the present application (1.42 eV–1.9 eV at room temperature) while maintaining lattice matching to substrate 11, which in this embodiment is GaAs. In a specific example, quantum wells 20, 21 and 22 are formed of InGaAs with barrier layers 25 and 26 formed of GaAs. Quantum wells 20, 21 and 22 and barrier layers 25 and 26 are each formed approximately 100 angstroms thick. Spacer layers 30 and 31 are formed of GaAs and cladding layers 33 and 34 are formed of InGaAsP ($E_g$=1.65 eV) lattice matched to the GaAs. Individual thicknesses of the layers are chosen in such a way that active region 12 has the optical thickness of approximately a full wave in the semiconductor material.

In order to further improve the VCSEL reliability, as well as to reduce the non-planarity of the structure, it is desirable to terminate etching within mirror stack 15 before the top surface of active region 12 is reached. This approach allows the fabricator to control the degree of the index-guiding in the structure, which is a function of the etch depth and is related to the effective refractive index step. In order to assure the accurate controllability of the etching process while simplifying the epitaxial growth of the structure, hybrid mirror stacks including first and second portions of materials selected to provide different rates of etching between the first and second portions to allow the second portion to be selectively etched with respect to the first portion are utilized.

Referring to FIG. 1, first mirror stack 10 includes a first portion 35 and a second portion 36 and second mirror stack 15 includes a first portion 37 and a second portion 38 (described generally in the order in-which they are grown). Some examples of materials that can be used for this purpose and in this specific embodiment are: alternating layers of GaAs and $Al_{0.80}Ga_{0.20}As$ to form the portions 35 and 38 and alternating layers of GaAs and InGaP to form portions 36 and 37 adjacent active region 12. Generally, since only mirror stack 15 will be etched, it is not necessary to form mirror stack 10 as a hybrid (two portions), except to accurately match mirror stacks 10 and 15.

The reflectivity of the individual pairs of layers is proportional to the difference in refractive indices ($\Delta n$) between adjacent materials. For emission wavelength of, for example, 0.98 μm, $\Delta n$ is equal to 13.2% and 7.1% for AlGaAs(0.8)/GaAs and InGaP/GaAs materials, respectively. Portion 38 of mirror stack 15 includes m-pairs of ¼λ alternating layers of AlGaAs(0.8)/GaAs layers and portion 37 includes n-pairs of ¼ alternating layers of InGaP/GaAs layers. Similarly, to maintain uniformity, portion 35 of mirror stack 10 includes m-pairs of ¼λ alternating layers of AlGaAs(0.8)/GaAs layers and portion 36 includes n-pairs of ¼λ alternating layers of InGaP/GaAs layers. It will be understood that m and n each include at least one pair of layers, since the mirror stacks would not be hybrid stacks if less than one pair of layers of different materials are included.

The m/n ratio corresponding to the reflectivity contributions from AlGaAs(0.8)/GaAs layers and InGaP/GaAs layers can be varied. AlGaAs(0.8)/GaAs and InGaP/GaAs materials were selected for this specific example because they can be selectively etched. Since InGaP and AlGaAs materials can be selectively etched, the depth of the etch through mirror stack 15 can be accurately controlled and a ridge waveguide, or patterned mirror, structure can be fabricated.

Figure 4:
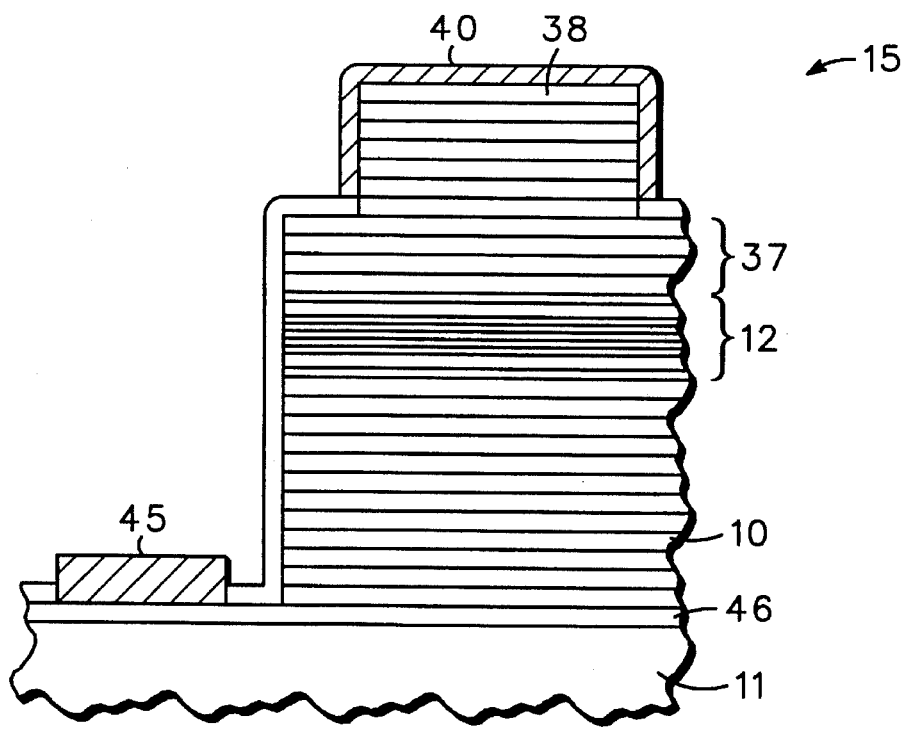
FIG. 4 is a simplified sectional view of a final stage in the fabrication of a patterned mirror VCSEL in accordance with the present invention.

With first mirror stack 10, active region 12 and second mirror stack 15 formed on substrate 11 as illustrated in FIG. 1 and including materials as described above, second portion 38 of second-mirror stack 15 is selectively etched, as illustrated in FIG. 4. Either wet or dry etch techniques can be performed. For the wet etching, using $H_2O_2$:$H_2O$:$H_2SO_4$/ HCl:$H_3PO_4$ based etchants can be used which etches selectively AlGaAs/InGaAsP. For dry etching, use of Cl/CH$_4$ chemistries are typically utilized. Due to the etch selectivity, patterned mirror, or ridge waveguide, VCSEL structures are formed by etching through second portion 38 of second mirror stack 15, down to first portion 37. Because the etching is accurate and does not damage active region 12, good electrical current and optical confinement is achieved to obtain low thresholds, while still maintaining good reliability (relative to a planar VCSEL). Further, in order to improve the VCSEL reliability, as well as to reduce the non-planarity of the structure, etching is terminated within mirror stack 15 before the top surface of active region 12 is reached. This approach allows the fabricator to control the degree of the index-guiding in the structure, which is a function of the etch depth.

Referring to FIG. 4, the structure illustrated in FIG. 4 is completed by performing the following steps. A p-type metallization 40 is formed on the exposed surface of upper mirror stack 15 by any known method. At least the portion of p-type metallization 40 overlying the upper surface of the mesa may be a transparent metal, such as ITO or the like. An n-type metallization 45 is formed in contact with mirror stack 10, for example on the upper surface of substrate 11, to provide another electrical contact for the VCSEL. Generally, a layer 46 of heavily doped semiconductor material is provided on the surface of substrate 11 to provide a better, low resistance contact to mirror stack 10 of the VCSEL. It will be understood that an electrical contact can be formed on the surface of substrate 11 opposite the surface on which mirror stack 10 if desired.

Thus, a new and improved method of fabricating VCSELs is disclosed and a new and improved method of fabricating patterned-mirrors for VCSELs is disclosed. Because the upper mirror stack is accurately and selectively etched to any desired depth, reliability is substantially increased. Also, because the active region of the VCSELs is aluminum-free, the reliability and the life span of the VCSELs is substantially increased. Further, because the selectivity of the etching is achieved by forming similar hybrid mirror stacks, fabrication of the VCSELs is not complicated by changes in material midway through the epitaxial growing process and unbalanced mirror stacks are not formed. That is, some changes in the epitaxial growing process must normally be made when moving from the lower mirror stack to the active region and then again when moving to the upper mirror stack. By making the changes in the material systems of the lower and upper mirror stacks adjacent the active region, a minimum amount of alterations in the epitaxial growing process is required.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating patterned mirror VCSELs comprising the steps of:

forming a first mirror stack of a first conductivity type, the first mirror stack being formed of a plurality Of pairs of relatively high and low index of refraction layers:

forming an active region on the first mirror stack;

forming a second mirror stack of a second conductivity type on the active region, the second mirror stack being formed of a first portion including at least one pair of relatively high and low index of refraction layers positioned on the active region and a second portion including at least one pair of relatively high and low index of refraction layers positioned on the first portion to form a complete second mirror stack, the number of pairs of relatively high and low index of refraction layers in the first and second portions, combined, being sufficient to provide a required reflectivity for operation of the VCSEL, and the first and second portions including forming the first portion of alternate layers of InGaP and GaAs and the second portion of alternate layers of AlGaAs and GaAs selected to provide different rates of etching between the first and second portions to allow the second portion to be selectively etched with respect to the first portion; and selectively etching the second portion of the second mirror stack by utilizing the first portion as an etch stop.

2. A method of fabricating patterned-mirrors for VCSELs comprising the steps of:

forming a first mirror stack of a first conductivity type, the first mirror stack being formed of a plurality of pairs of relatively high and low index of refraction layers of AlGaAs and GaAs;

forming an active region on the first mirror stack, the active region being formed of aluminum-free material;

forming a second mirror stack of a second conductivity type on the active region, the second mirror stack being formed of a first portion including at least one pair of relatively high and low index of refraction layers including InGaP and GaAs positioned on the active region and a second portion including at least one pair of relatively high and low index of refraction layers including AlGaAs and GaAs positioned on the first portion to form a complete second mirror stack, and the number of pairs of relatively high and low index of refraction layers in the first and second portions, combined, being sufficient to provide a required reflectivity for operation of the VCSEL; and selectively etching the second portion of the second mirror stack by utilizing the first portion as an etch stop.

3. A method of fabricating patterned-mirrors for VCSELs as claimed in claim 2 wherein the step of forming an active region of aluminum-free material includes forming the active region of three quantum well layers of InGaAs having two barrier layers of GaAs sandwiched therebetween.

4. A method of fabricating patterned-mirrors for VCSELs as claimed in claim 3 wherein the step of forming an active region of aluminum-free material further includes forming two spacer layers of GaAs with the three quantum wells and two barrier layers sandwiched therebetween.

5. A method of fabricating patterned-mirrors for VCSELs as claimed in claim 4 wherein the step of forming an active region of aluminum-free material further includes forming two layers of InGaAsP and with the two spacer layers, the three quantum wells and the two barrier layers sandwiched therebetween.

6. A method of fabricating patterned-mirrors for VCSELs as claimed in claim 5 wherein the step of forming an active region of aluminum-free material further includes forming the two layers of InGaAsP, the two spacer layers, the three quantum wells and the two barrier layers sandwiched therebetween approximately one optical wavelength thick.

7. A method of fabricating VCSELs as claimed in claim 2 wherein the step of selectively etching the second portion of the second mirror stack by utilizing the first portion as an etch stop includes performing a wet etch utilizing $H_2O_2:H_2O:H_2SO_4$/HCL:$H_3PO_4$ based etchants.

8. A method of fabricating VCSELs as claimed in claim 2 wherein the step of selectively etching the second portion of the second mirror stack by utilizing the first portion as an etch stop includes performing a dry etch utilizing Cl/CH$_4$ based etchants.

9. A patterned mirror VCSEL comprising:

a substrate;

a first mirror stack of a first conductivity type positioned on the substrate, the first mirror stack being formed of a plurality of pairs of relatively high and low index of refraction layers of AlGaAs and GaAs;

an active region positioned on the first mirror stack, the active region being formed of aluminum-free material; and a second mirror stack of a second conductivity type positioned on the active region, the second mirror stack being formed of a first portion including at least one pair of relatively high and low index of refraction layers including InGaP and GaAs and positioned on the active region and a second portion including at least one pair of relatively high and low index of refraction layers including AlGaAs and GaAs positioned on the first portion to form a complete second mirror stack, and the number of pairs of relatively high and low index of refraction layers in the first and second portions, combined, being sufficient to provide a required reflectivity for operation of the VCSEL; and the second portion of the second mirror stack being patterned to the first portion to define a lasing region.

10. A patterned mirror VCSEL as claimed in claim 9 wherein the active region of aluminum-free material includes three quantum well layers of InGaAs having two barrier layers of GaAs sandwiched therebetween.

11. A patterned mirror VCSEL as claimed in claim 10 wherein the active region of aluminum-free material further includes two spacer layers of GaAs with the three quantum wells and two barrier layers sandwiched therebetween.

12. A patterned mirror VCSEL as claimed in claim 11 wherein the active region of aluminum-free material further includes two layers of InGaAsP with the two spacer layers, the three quantum wells and the two barrier layers sandwiched therebetween.

13. A patterned mirror VCSEL as claimed in claim 12 wherein the active region of aluminum-free material further includes the two layers of InGaAsP, the two spacer layers, the three quantum wells and the two barrier layers sandwiched therebetween and formed approximately one optical wavelength thick.

14. A patterned mirror VCSEL as claimed in claim 9 wherein the plurality of pairs of relatively high and low index of refraction layers of the first mirror stack and the second portion of the second mirror stack each include alternate layers of GaAs and Al$_{0.80}$Ga$_{0.20}$As.

* * * * *

UNITED STATES PATENT AND TRADEMARK OFFICE
CERTIFICATE OF CORRECTION

PATENT NO. : 5,557,626

DATED : September 17, 1996

INVENTOR(S) : Piotr Grodzinski
Michael S. Lebby
Hseng-Chung Lee

It is certified that error appears in the above-indentified patent and that said Letters Patent is hereby corrected as shown below:

Claim 1, column 5, line 61
Delete "Of" and insert --of-- therefor.

Claim 1, column 5, line 62
Delete ":" and insert --;-- therefor.

Claim 3, column 6, line 42
Delete "an" and insert --the-- therefor.

Claim 4, column 6, line 47
Delete "an" and insert --the-- therefor.

Claim 5, column 6, line 52
Delete "an" and insert --the-- therefor.

Claim 6, column 6, line 58
Delete "an" and insert --the-- therefor.

Signed and Sealed this

Sixteenth Day of September, 1997

Attest:

BRUCE LEHMAN

*Attesting Officer*                *Commissioner of Patents and Trademarks*